US009571095B2

(12) United States Patent
Ma et al.

(10) Patent No.: US 9,571,095 B2
(45) Date of Patent: Feb. 14, 2017

(54) TOUCH DEVICE WITH CURVED SURFACE

(71) Applicants: Interface Optoelectronics (Shenzhen) Co., Ltd., Shenzhen, Guangdong (CN); GENERAL INTERFACE SOLUTION LIMITED, Miaoli County (TW)

(72) Inventors: Chen-Yun Ma, Taipei (TW); Sheng-Wei Chen, Miaoli County (TW)

(73) Assignees: INTERFACE OPTOELECTRONICS (SHENZHEN) CO., LTD., Shenzhen, Guangdong (CN); GENERAL INTERFACE SOLUTION LIMITED, Miaoli County (TW)

( * ) Notice: Subject to any disclaimer, the term of this patent is extended or adjusted under 35 U.S.C. 154(b) by 10 days.

(21) Appl. No.: 14/551,061

(22) Filed: Nov. 23, 2014

(65) Prior Publication Data

US 2015/0077657 A1 Mar. 19, 2015

(30) Foreign Application Priority Data

Jul. 30, 2014 (CN) .......................... 2014 1 0371400

(51) Int. Cl.
H01J 1/62 (2006.01)
G06F 3/14 (2006.01)
H03K 17/96 (2006.01)
G02F 1/1333 (2006.01)
G06F 1/16 (2006.01)

(52) U.S. Cl.
CPC ........... *H03K 17/96* (2013.01); *G02F 1/13338* (2013.01); *G02F 1/133308* (2013.01); *G06F 1/1626* (2013.01); *G06F 1/1643* (2013.01); *G02F 2001/133331* (2013.01); *H03K 2217/96031* (2013.01)

(58) Field of Classification Search
CPC .................... H03K 17/96; H03K 2217/96031; G06F 1/1626; G06F 1/1643; G02F 1/133308; G02F 1/13338; G02F 2001/133331
See application file for complete search history.

(56) References Cited

U.S. PATENT DOCUMENTS

| 9,058,154 B2 * | 6/2015 | Cho | G06F 1/1626 |
| 2009/0033634 A1 * | 2/2009 | Shih | G06F 1/1626 345/173 |
| 2012/0250276 A1 * | 10/2012 | Nakajima | G06F 1/1626 361/752 |
| 2013/0002133 A1 * | 1/2013 | Jin | G06F 1/1626 313/511 |
| 2013/0021289 A1 * | 1/2013 | Chen | G06F 1/1601 345/174 |
| 2013/0235285 A1 * | 9/2013 | Rowe | G02F 1/13338 349/12 |
| 2014/0063719 A1 * | 3/2014 | Yamazaki | G06F 1/1601 361/679.21 |
| 2014/0104185 A1 * | 4/2014 | Hu | G06F 3/044 345/173 |

* cited by examiner

Primary Examiner — Tracie Y Green
(74) Attorney, Agent, or Firm — Locke Lord LLP; Tim Tingkang Xia, Esq.

(57) ABSTRACT

A curved touch device is provided in the present invention including a back cover and a touch panel corresponding to the back cover, where at least one edge portion of the touch panel is a curve surface jointing with the one edge of the back cover.

9 Claims, 4 Drawing Sheets

TOUCH DEVICE WITH CURVED SURFACE

BACKGROUND OF THE INVENTION

1. Field of the Invention

The present invention generally relates to a touch device, and more particularly, to a touch device with curved surface for touch control.

2. Description of the Prior Art

Nowadays the electronic device with touch control functions is very popular in mass market, since the touch control function may provide excellent human-computer interaction for the user to operate the device using fingers or stylus pen. The touch control is not limited to being applied to a smart phone. More and more electronic devices, such as the Ultrabook, are also provided with a touch panel for touch control. Thus one might expect the touch control function in the electronic device would be more and more popular in the future.

At present, in the manufacture of notebooks, the manufacturer would first purchase the parts of touch panel, liquid-crystal module and the backlight module, and then assembles the three components into one notebook. Since all of the above-mentioned parts would have respective reserved spaces, the notebook after assembly would have a thickness larger than expected. Especially for the Ultrabook which lays stress on compact and slim design, conventional assembly methods can't further reduce the thickness of the end product to meet the product's requirement. Accordingly, by using advanced thin hinge-up assembly method, the necessary parts such as back cover and panel frame can be saved, and the thickness of the device and the cost can be further reduced.

Nevertheless, there are still a few problems in the thinning progress of the touch panel for the designer to overcome. For example, nowadays the function buttons of touch panel are generally disposed at lateral sides of the touch panel, such as the power button, volume button, or general button. Theses physical buttons need a certain thickness and space to be disposed on the lateral side of the panel, which would impede the development of touch panel with slim design.

SUMMARY OF THE INVENTION

In view of the above-identified limitation in the progress to thin the touch device, the present invention provides a novel touch panel design with curved surface for replacing the sidewall of a panel or the back cover and providing the area to dispose touch function buttons, thereby achieving a flexible appearance and further thinning design.

One objective of the present invention is to provide a curved touch device including a back cover and a touch panel fitting with the back cover, wherein at least one edge portion of the touch panel is a curved surface, and the curve surface joints one edge of the back cover.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
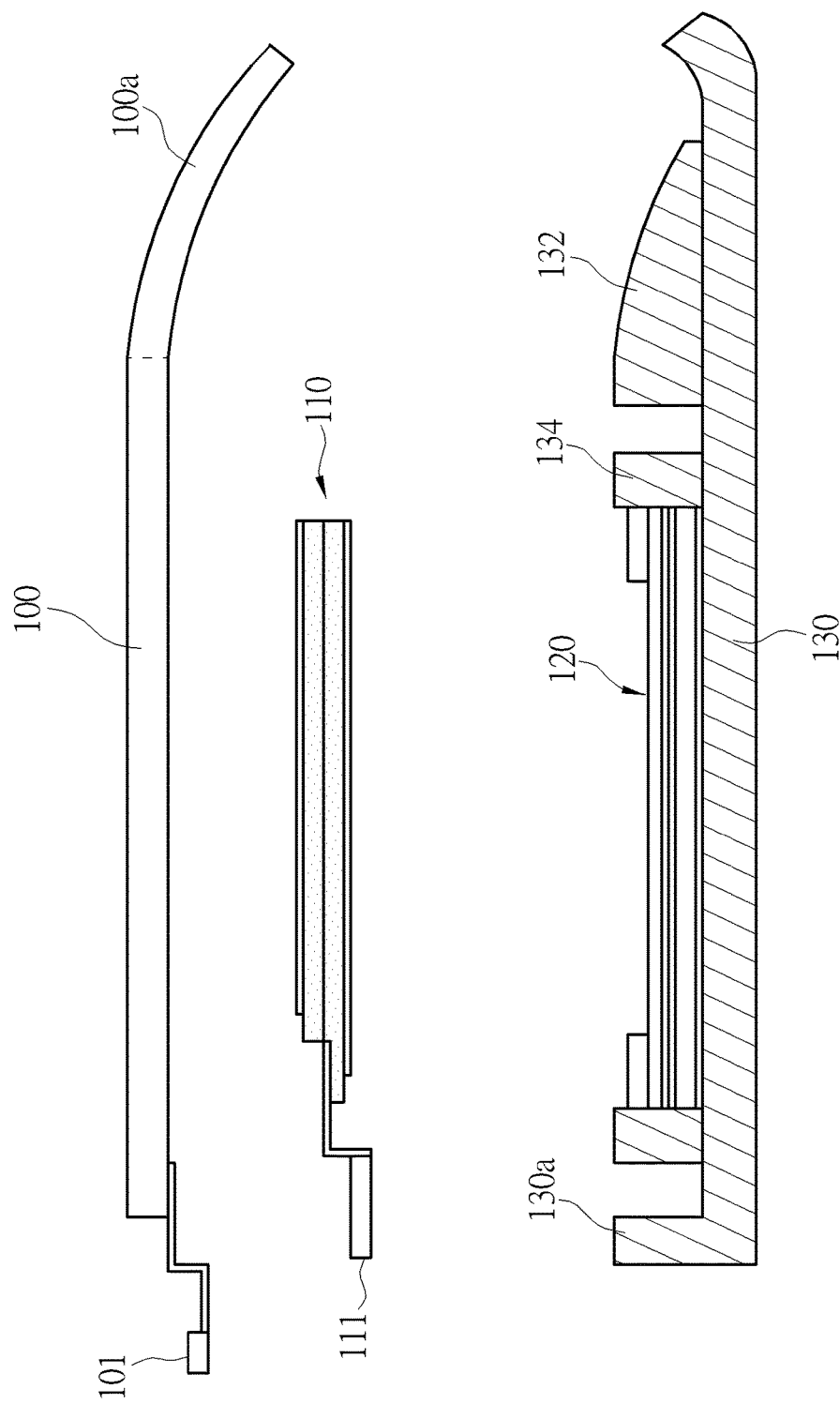
FIG. 1 is a cross-sectional view schematically illustrating the assembly of a touch panel, a liquid-crystal module (LCM), a backlight module, and back cover in accordance with the embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

First, please refer to FIG. 1, which is a cross-sectional view schematically illustrating the assembly of a touch panel, a liquid-crystal module (LCM), a backlight module, and back cover in accordance with the embodiment of the present invention. As shown in FIG. 1, the touch device with curved surface of the present invention is mainly composed of a touch panel 100, a liquid-crystal module 110, a backlight module 120, and a back cover 130. The touch panel may be a one glass solution (OGS) touch panel or a one plastic solution (OPS) touch panel which is manufactured by forming touch-sensing structures such as touch electrodes (for example, an ITO conductive layer) on a reinforced transparent cover material, and the generating touch signals are transmitted to an external flexible printed circuit board through the conductive lines 101. Alternatively, the touch panel 100 may be a cover glass with touch-sensing layers formed thereon. The essential feature of the present invention is the design of curved surface (portion) 100a in at least one edge portion, as shown in FIG. 1. The curved surface 100a not only provides beautiful exterior and flexible appearance, but also provides the efficacy of further thinning the entire touch device in the assembly. Relevant details will be described in the following embodiment.

The liquid-crystal module 110 may be an open cell of the LCD panel which has completed front-end array process such as the manufacture of the thin-film transistors and middle-end cell process such as the irrigation of the liquid-crystal and panel cutting. The driving signal and control signal are received from an external printed circuit board 111 through electrically connected conductive lines. The image is displayed when the light from the backlight module 120 beneath passes through the liquid-crystal module 110.

Back cover 130 is the base of entire curved touch device, which may be applied as the back cover (A-part) of a notebook or a frame structure of a smart phone, and may be, for example, formed of light metals such as aluminum or magnesium by punching or pressure casting. The back cover 130 is used to accommodate the backlight module 120 and the liquid-crystal module 110 and may fit neatly with the touch panel 100 to constitute the shell of curved touch device. In the embodiment, since the back cover 130 is designed to fit the curved surface 100a of the touch panel 100, it is shown in FIG. 1 that only one side of the back cover 130 is provided with a sidewall 130a, while the other side is provided with a reinforced flange structure 130 for support strength. The back cover 130 is further provided with a locating piece 134 to fix the backlight module 120 disposed therein. The features of above components and relevant assembly steps will be described in more details in the following embodiment.

Figure 2:
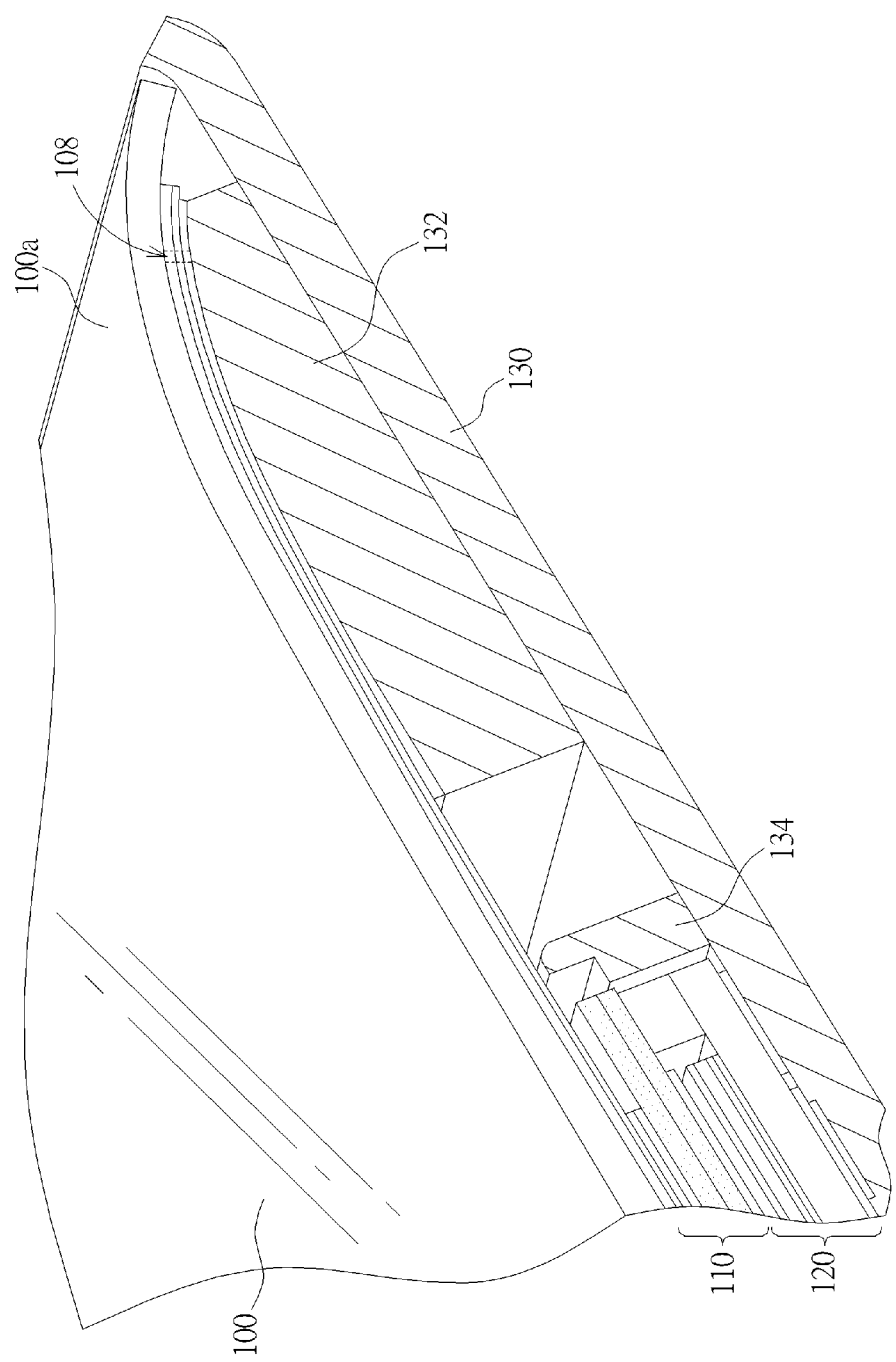
FIG. 2 is an enlarged view schematically illustrating the touch device after assembly in accordance with the embodiment of the present invention.

Please refer now to FIG. 2, which is an enlarged view schematically illustrating the touch device after assembly in accordance with the embodiment of the present invention. In the embodiment, as shown in FIG. 2, the touch panel 100 of the present invention includes a curved surface 100a on at least one edge portion. The curved surface 100a extends to and joints the edge of the back cover 130 beneath. A flange 132 is disposed and sealed properly between the curved portion 100a and the back cover 130 to provide support strength, especially in the configuration that the curved surface 100a is designed to show one or more touch buttons or touch icons. Please note that the design of the present invention is not limited to only one curved surface (portion) in the touch panel 100. The designs of single edge curved surface, two edges curved surface, opposite edges curved surface, or even the four edges or multi-edges curved surface may also be applied in the present invention depending on actual design requirements of the product. In addition, the flange 132 and the locating piece 134 may be integrated into one piece.

On another aspect, one essential feature of the present invention is that the above-identified curved surface design of the touch panel may be combined with the mainstream hinge-up assembly method. As shown in FIG. 2, a locating piece 134 is formed on a predetermined position of the back cover 130 to fix the backlight module 120. Thus the backlight module 120 is directly embedded and integrated in available interior space formed by the back cover. This means it is unnecessary in the design of the present invention to reserve additional spaces or to dispose an additional back frame for accommodating required interior components such as backlight module 120 like those in prior art.

Furthermore, as shown in FIG. 2, the backlight module 120, liquid-crystal module 110, and outermost touch panel 100 in the present invention are tightly bonded by advanced direct bonding (ADB) method. Through this design, the total thickness of the backlight module 120 and the liquid-crystal module 110 would not exceed the predetermined assembly thickness (for example, about the height of the locating piece 134) of the back cover 130 and the touch panel 100. By collocating with the above-mentioned ADB method and the hinge-up assembly process, the design of the present invention may further thin the touch device compared to those methods and designs used in prior art. The design of the present invention is particularly suitable for the application of extra slim Ultrabook or new-type smart phone.

Figure 3:
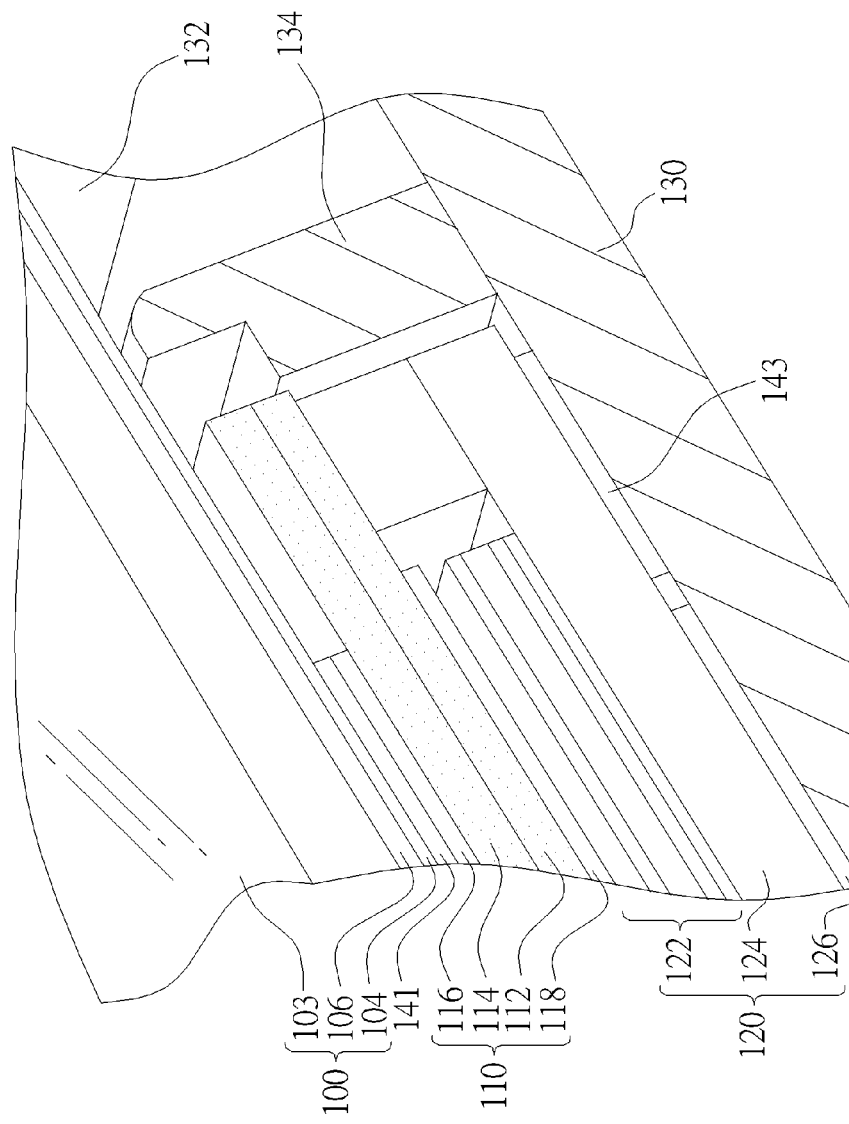
FIG. 3 is an enlarged view schematically illustrating the components of the liquid-crystal module and the backlight module.

Please refer now to FIG. 3, which is an enlarged view schematically illustrating the components of the liquid-crystal module 110 and the backlight module 120. As shown in FIG. 3, the liquid-crystal module 110 and the backlight module 120 are both disposed in the accommodation space defined by the locating pieces 134 of back cover 130. The total height of structure would not exceed the height of the locating piece 134 in order to facilitate the slim hinge-up assembly. A first touch-sensing layer 106 (ex. ITO electrode layer) and a second touch-sensing layer 104 (ex. ITO electrode layer) are sequentially bonded on the cover glass 103 by using optical clear adhesive (OCA) or optical clear resin (OCR). The cover glass 103, the first touch-sensing layer 106 and the second touch-sensing layer 104 constitute the touch panel 100 with touch control function. Furthermore, it should be noted that the first touch-sensing layer 106 and the second touch-sensing layer 104 is designed to encompass the whole inner surface of the cover glass 103, including the curved surface 100a. This means the touch control function may also be performed on the curved surface 100a (FIG. 2). The liquid-crystal module 110 is composed of a thin-film transistor (TFT) layer 112, a color filter (CF) 114 and upper/lower polarizers 116/118. An optical clear resin (OCR, or optical film for short) may be filled between the liquid-crystal module 110 and the touch panel 100 to bond the two components. In addition, as shown in FIG. 2, since the first touch-sensing layer 106 and the second touch-sensing layer 104 are designed to be bonded on the cover glass 103 with curved surface, the portions of first touch-sensing layer 106, the second touch-sensing layer 104 and the optical film 141 corresponding to the curved surface/portion of the touch panel 100 may be provided with holes 108 to release the stress in the curved region and prevent the bubble issue and peeling issue resulting from the stress in the adhesion process. The holes 108 may be designed to run through or not the three layer structure of the first touch-sensing layer 106, the second touch-sensing layer 104 and the optical film 141.

On another aspect, as shown in FIG. 3, the backlight module 120 is composed of a reflecting layer 126, a light-guiding plate 124, and an optical adjusting layer 122, wherein the optical adjusting layer 122 may include a plurality of layer structures, such as upper and lower diffusion sheets and brightness enhancement films (BEF). The optical adjusting layer 122 is used hereinafter to represent those multiple layers. The backlight module 120 and the back cover 130 may be bonded together by adhesives 143. The above-identified components of touch panel 100, liquid-crystal module 110, and the backlight module 120 are well-known by those of skilled in the art, thus repetitious details need not be given herein so as not to obscure the subjects of the present invention.

Figure 4:
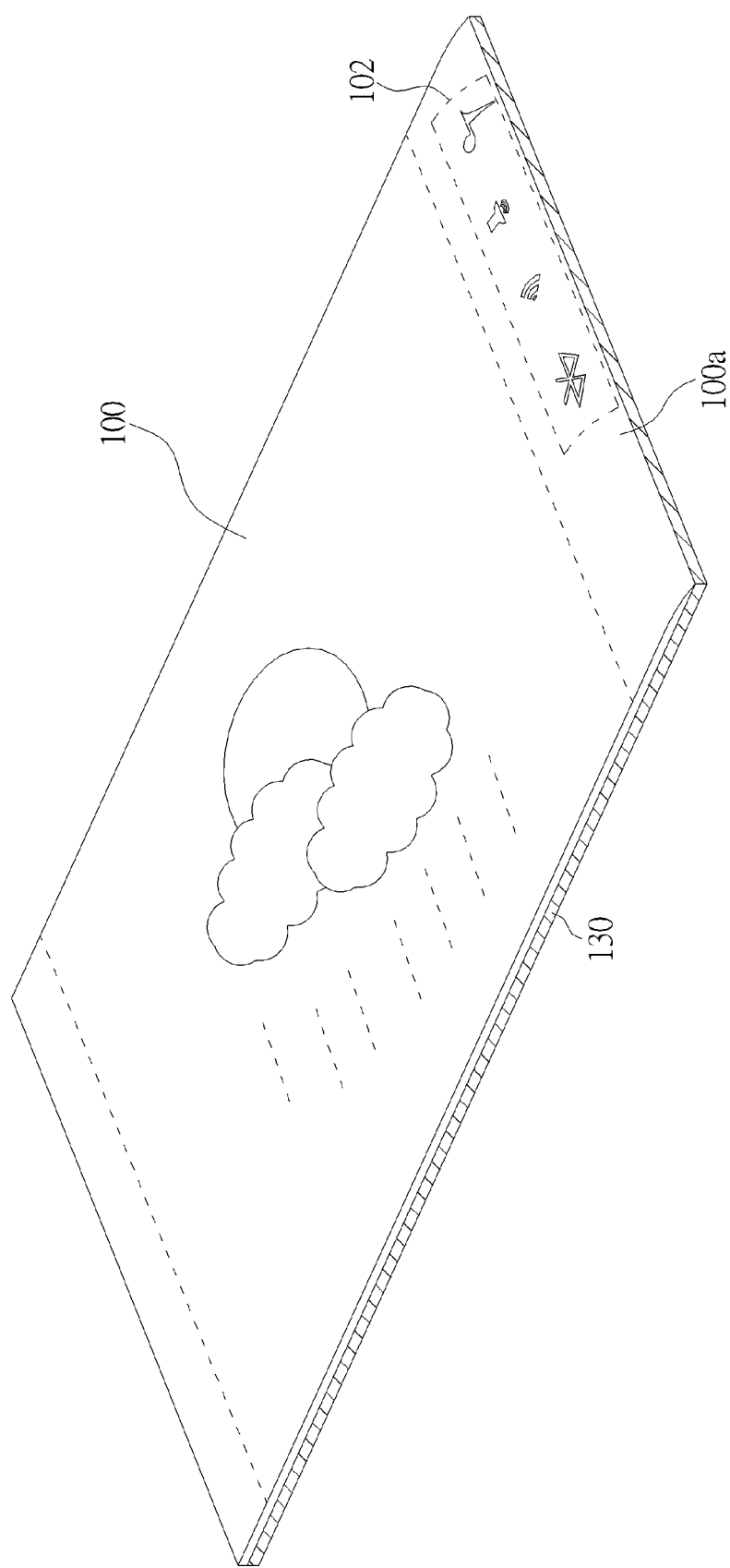
FIG. 4 is a general appearance view of the touch device in accordance with the embodiment of the present invention.

At last, please refer to FIG. 4, which illustrates a general appearance of the touch device in accordance with the embodiment of the present invention. The curved surface design provided by the present invention not only achieves the efficacy of further thinning the touch device, but also invokes a creative design element in the edge or the portion of black matrix of the touch device. As shown in FIG. 4, in the present invention, the touch-sensing layer 104, 106 of the touch panel 100 may be designed to extend to and encompass the whole curved surface 100a of the touch panel 100. Thus, the curved surface 100a may be disposed with a number of touch buttons to permit the touch control function, such as the function buttons of music, volume, Wi-Fi, or Bluetooth shown in the figure. The function buttons may be formed by simple processes such as directly ink printing on the inner surface of the touch panel. Alternatively, the touch-sensing layer of the touch panel may extend to and encompass only the region with touch button 102 in black matrix portion, thus the touch-sensing material may be saved without affecting the desired touch control function. Alternatively, in other embodiment, the function buttons may be presented by image forms. This configuration would allow even more flexible appearance design and versatile functions designs for the touch device.

In prior art, all of the above-identified function buttons are generally designed in the form of physical buttons disposed on the lateral surfaces of the touch device, thus it is necessary in prior art to provide area and space for disposing those physical buttons and mechanism. In comparison to prior art, the present invention provides the technology of ADB and hinge-up assembly to further thin the device. More importantly, the design of a curved surface replaces conventional lateral surfaces or sidewalls with physical buttons, thus the virtual, image-type function buttons may be used on the smooth curved surface with touch control mode. The invention not only takes up less space for necessary components, but also reserves the function buttons and provides even more beautiful exterior and flexible appearance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A curved touch device, comprising:
    a plurality of virtual touch buttons;
    a back cover; and
    a touch panel fitting with said back cover, comprising:
        at least one edge portion; and
        a center portion abutting said at least one edge portion;
    wherein said at least one edge portion has a curved surface, said center portion has a flat surface, and said curve surface joints one edge of said back cover;
    wherein said plurality of virtual touch buttons are disposed only on said curved surface.

2. The curved touch device of claim 1, wherein said touch panel is a one glass solution (OGS) touch panel, a one plastic solution (OPS) touch panel, or a cover glass with touch-sensing layer.

3. The curved touch device of claim 1, wherein said touch panel further comprises one or more touch-sensing layer and optical film, and the portion of said touch-sensing layer and said optical film corresponding to said curved surface of said touch panel are provided with holes.

4. The curved touch device of claim 1, wherein said plurality of virtual touch buttons comprises volume button, Bluetooth button, reply button, or power button.

5. The curved touch device of claim 1, further comprising a flange for support strength between said curved surface and said back cover.

6. The curved touch device of claim 5, wherein said flange and said back cover are integrated.

7. The curved touch device of claim 1, further comprising a backlight module disposed in the accommodation space formed by said back cover and a liquid crystal module disposed between said touch panel and said backlight module.

8. The curved touch device of claim 7, wherein said backlight module, said liquid crystal module and said touch panel are assembled by advanced direct bonding.

9. The curved touch device of claim 7, wherein said backlight module is disposed in said back cover by hinge-up assembly.

* * * * *